United States Patent
Konda

(10) Patent No.: US 9,203,048 B2
(45) Date of Patent: Dec. 1, 2015

(54) ORGANIC ELECTROLUMINESCENCE DEVICE

(71) Applicant: Panasonic Intellectual Property Management Co., Ltd., Osaka (JP)

(72) Inventor: Tetsushi Konda, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/521,294

(22) Filed: Oct. 22, 2014

(65) Prior Publication Data
US 2015/0123103 A1    May 7, 2015

(30) Foreign Application Priority Data

Nov. 1, 2013  (JP) .................................. 2013-227912

(51) Int. Cl.
*H01L 51/52*    (2006.01)
(52) U.S. Cl.
CPC ........ *H01L 51/5246* (2013.01); *H01L 51/5253* (2013.01)
(58) Field of Classification Search
CPC ............ H01L 51/5246; H01L 51/5253; H01L 51/5256
USPC .......................................................... 257/40
See application file for complete search history.

(56) References Cited

U.S. PATENT DOCUMENTS

| | | |
|---|---|---|
| 2005/0249890 A1 | 11/2005 | Murakami et al. |
| 2011/0052926 A1 | 3/2011 | Nakamura et al. |
| 2015/0034928 A1* | 2/2015 | Yamamoto .............. H01L 27/32 257/40 |

FOREIGN PATENT DOCUMENTS

| | | |
|---|---|---|
| JP | 2006-241450 | 9/2006 |
| JP | 2006-331694 | 12/2006 |
| JP | 2008-181832 | 8/2008 |
| JP | 2008-293676 | 12/2008 |
| JP | 2011-054297 | 3/2011 |
| JP | 2011-094046 | 5/2011 |
| WO | 03/102639 | 12/2003 |

\* cited by examiner

*Primary Examiner* — Daniel Shook
(74) *Attorney, Agent, or Firm* — Renner, Otto, Boisselle & Sklar, LLP

(57) ABSTRACT

An organic electroluminescence device comprise an organic electroluminescence element including a pair of electrodes and an organic layer disposed between the pair of electrodes and a sealing resin layer covering a surface of the organic electroluminescence element. The organic layer includes an emitting layer. The sealing resin layer includes a thermoplastic resin composite. The thermoplastic resin composite contains a matrix resin component constituted by at least one resin having a molecular weight of 5000 or more. A content of an organic component having a molecular weight of less than 500 in the thermoplastic resin composite is less than 6 ppm.

9 Claims, 2 Drawing Sheets ies filed on Nov. 1, 2013, the contents of which are hereby incorporated by reference.

ORGANIC ELECTROLUMINESCENCE DEVICE

This application claims priority to Japanese Patent Application No. 2013-227912, filed on Nov. 1, 2013, the contents of which are hereby incorporated by reference.

BACKGROUND

1. Technical Field

The present disclosure relates to an organic electroluminescence device.

2. Description of the Related Art

Organic electroluminescence devices are surface emitting devices and are suitable for achieving reduction in weight and producing flexible devices (hereafter, the term "electroluminescence" is sometimes abbreviated as "EL"). Accordingly, in recent years, organic EL devices have been attracting a great deal of attention as next-generation emitting devices.

Organic EL devices are divided on the basis of the direction of light extraction into top emission type devices and bottom emission type devices. In a known configuration of such a top emission type device, for the purpose of achieving a high light extracting efficiency, the space between an organic EL element and a sealing member is filled with a transparent material. For example, Japanese Unexamined Patent Application Publication No. 2008-293676 (Patent Literature 1, hereafter PTL 1) describes an organic EL device 200 illustrated in FIG. 4. In the organic EL device 200, the space between an organic EL element 202 and a sealing substrate 205 is filled with a sealing material 204 composed of a resin material. A transparent protective layer 203 formed of an inorganic material excellent in terms of gas barrier property is disposed between the sealing material 204 and the organic EL element 202. In the organic EL device 200, the organic EL element 202 is disposed on a substrate 201. The organic EL element 202 includes an electrode 206, an organic EL layer 207, an electron injection layer 208, and an electrode 209.

SUMMARY

As described above, typically, a protective layer formed of an inorganic material excellent in terms of gas barrier property is disposed on the surface of an organic EL element. Accordingly, there have not been sufficient studies on a configuration in which a resin material directly covers the surface of an organic EL element.

One non-limiting and exemplary embodiment provides an organic electroluminescence device having high reliability even when it has a configuration in which a resin material directly covers the organic EL element.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

An organic EL device according to an embodiment of the present disclosure includes an organic electroluminescence element including a pair of electrodes and an organic layer disposed between the pair of electrodes, and a sealing resin layer covering a surface of the organic electroluminescence element, wherein the organic layer includes an emitting layer, the sealing resin layer is formed of a thermoplastic resin composite, and the thermoplastic resin composite contains a matrix resin component constituted by at least one resin having a molecular weight of 5000 or more and a content of an organic component having a molecular weight of less than 500 in the thermoplastic resin composite is less than 6 ppm.

Note that comprehensive or specific embodiments of the present disclosure may include lighting devices, lighting systems, electronic devices, and methods. Comprehensive or specific embodiments of the present disclosure may further include desired combinations of lighting devices, lighting systems, electronic devices, and methods.

DETAILED DESCRIPTION

Figure 1:
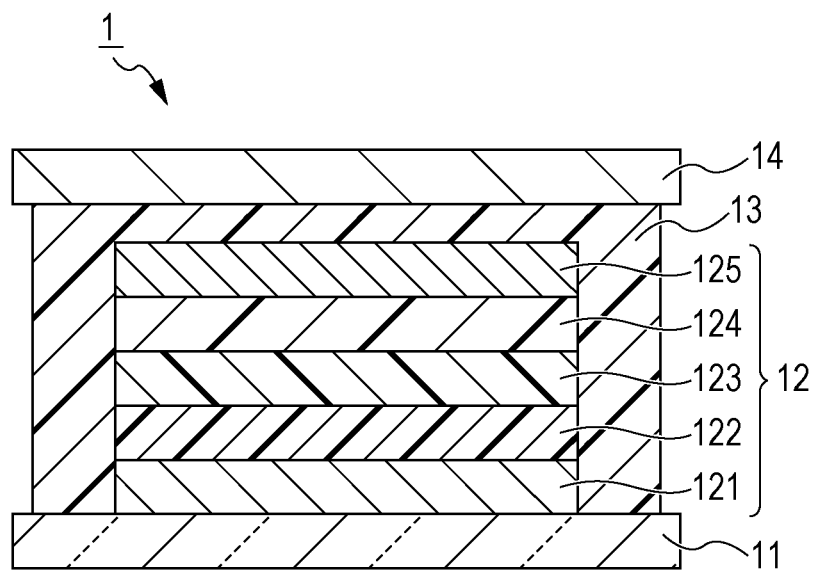
FIG. 1 is a cross sectional view of a bottom emission type organic EL device according to a first embodiment of the present disclosure.

As described above, some top emission type organic EL devices have a configuration in which the organic EL element is covered with a transparent sealing material. For example, this configuration is intended to prevent adverse effects caused by moisture outside the organic EL element and to achieve a high light extracting efficiency. Also, some bottom emission type organic EL devices have a configuration in which the organic EL element is covered with a sealing material for the purpose of preventing adverse effects caused by moisture outside the organic EL element.

The inventors of the present application found that, when organic EL elements are directly covered with resin materials, the organic EL elements are somehow affected, resulting in problems such as a considerable decrease in luminance life. The inventors also found that these problems occur in top emission type and bottom emission type organic EL devices. For such reasons, when a typical resin material is used as the sealing material, for example, as in the organic EL device in PTL 1, the surface of the organic EL element has been required to be covered with a protective layer formed of an inorganic material.

The inventors further performed thorough studies and have found that the problems relate to the molecular weight of such a resin material. Specifically, the inventors have found that the problems relate to the molecular weight of a matrix resin component serving as a major component of the resin material, and the content of an organic component having a low molecular weight in the resin material. Thus, the inventors have found that use of a resin composite according to the present disclosure can provide organic EL devices having high reliability.

Hereinafter, the present disclosure will be described further in detail with reference to embodiments.

First Embodiment

A resin composite used in an organic EL device according to an embodiment of the present disclosure will be described.

The resin composite used in the organic EL device of the present embodiment contains a resin having a molecular weight of 5000 or more, that is, a matrix resin component constituted by at least one resin having a minimum molecular weight of 5000 or more. The term "matrix resin component" denotes a polymerized resin component. The matrix resin component may be constituted by one or more of such resins. To the resin composite of the present embodiment, polymerized resin components having a molecular weight of less than 5000 are not deliberately added. However, for example, in some cases where polymerization does not sufficiently proceeds, the resin composite may contain a small amount of a polymerized resin component having a molecular weight of slightly less than 5000. The term "small amount" denotes such an amount that advantages of the present disclosure are not affected and, for example, about 5% by mass or less relative to the total mass of the "polymerized resin components" of the resin composite.

Such a resin constituting the matrix resin component has a molecular weight of 5000 or more. When the resin constituting the matrix resin component of a resin composite has a molecular weight of less than 5000, in a configuration where an organic EL element is directly covered with the resin composite, the matrix resin component tends to enter the organic EL element. As a result, the structure of the organic EL element is destroyed and luminance characteristics are degraded. For the purpose of suppressing permeation of the matrix resin component into the organic EL element with more certainty and achieving better luminance characteristics thereby, the resin constituting the matrix resin component may be selected from resins having a molecular weight of 10000 or more, or 50000 or more.

The resin constituting the matrix resin component is not particularly limited as long as it has a molecular weight of 5000 or more. For example, the resin may be a resin obtained by polymerizing at least one selected from methacrylic monomers and acrylic monomers. Also the resin may be a polyester resin, a polyurethane resin, or a polystyrene resin. The resin constituting the matrix resin component is desirably selected from resin systems that do not react during sealing.

The resin composite of the present embodiment may contain no organic component having a molecular weight of less than 500 (low molecular weight organic component). However, the resin composite may contain a small amount of the low molecular weight organic component. Specifically, when the resin composite contains the low molecular weight organic component, the content of the low molecular weight organic component in the resin composite is less than 6 ppm. When the content of the low molecular weight organic component is less than 6 ppm, in a configuration where an organic EL element is directly covered with the resin composite, the effects exerted on the element by the low molecular weight organic component having entered the element can be reduced to such a low degree that luminance characteristics are not considerably degraded. The effects exerted on the element are, for example, destruction of the element structure and inhibition of movements of electrons and holes.

In order to prevent considerable degradation of luminance characteristics with more certainty, the content of the low molecular weight organic component in the resin composite may be set to less than 5.1 ppm, or less than 1 ppm.

Examples of the low molecular weight organic component contained in the resin composite include catalytic ingredients, antioxidative components, polymerization inhibitors, ultraviolet absorbers, and raw material monomers.

The water content of the resin composite of the present embodiment is desirably minimized. However, the resin composite may contain a small amount of water. When the resin composite contains water, the water content in the resin composite may be set to less than 6 ppm. When the water content is set to less than 6 ppm, in a configuration where an organic EL element is directly covered with the resin composite, the effects exerted on the element by water having entered the element can be reduced to such a low degree that luminance characteristics are not considerably degraded. The effects exerted on the element are, for example, destruction of the element structure and inhibition of movements of electrons and holes. In order to prevent considerable degradation of luminance characteristics with more certainty, the water content in the resin composite may be set to less than 1 ppm, or less than 0.1 ppm.

The resin composite of the present embodiment at least satisfies the following conditions: the resin constituting the matrix resin component has a molecular weight of 5000 or more and the content of an organic component having a molecular weight of less than 500 is less than 6 ppm. In addition to the matrix resin component and the low molecular weight organic component, the resin composite of the present embodiment may contain an organic component having a molecular weight of 500 or more and less than 5000. When the resin composite of the present embodiment contains an organic component having a molecular weight of 500 or more and less than 5000, the content of this organic component is not particularly limited and may be 5% by mass or less, or 1% by mass or less.

Hereinafter, an organic EL device according to an embodiment of the present disclosure will be described. The organic EL device of the present embodiment includes an organic EL element and a sealing resin layer covering the organic EL element. The sealing resin layer is formed of the above-described resin composite. The organic EL device of the present embodiment will be described below with reference to a drawing.

An organic EL device 1 in FIG. 1 is an example of bottom emission type organic EL devices. The organic EL device 1 includes a transparent substrate 11; an organic EL element 12 disposed on the transparent substrate 11; a sealing resin layer 13 disposed on the surfaces of the transparent substrate 11 and the organic EL element 12 so as to cover the surface of the organic EL element 12; and a sealing substrate 14 bonded to the transparent substrate 11 via the sealing resin layer 13.

Light emitted from the organic EL element 12 is extracted through the transparent substrate 11. The transparent substrate 11 may be selected from transparent substrates (such as glass substrates) used for known organic EL devices. The transparent substrate 11 is not particularly limited in terms of shape, structure, size, or the like and can be appropriately selected in accordance with the desired organic EL device.

The organic EL element 12 includes a multi-layer film including a transparent electrode (anode) 121 disposed on the transparent substrate 11, a hole injection layer 122 disposed on the transparent electrode 121, a hole transport layer 123 disposed on the hole injection layer 122, an emitting layer 124 disposed on the hole transport layer 123, and an electrode (cathode) 125 disposed on the emitting layer 124. In this example, the hole injection layer 122, the hole transport layer 123, and the emitting layer 124 correspond to the organic layer including an emitting layer. The configuration of the multi-layer film constituting the organic EL element 12 is not limited to this example because the organic EL element 12 can be selected from organic EL elements used for known bottom emission type organic EL devices. For example, if necessary, an electron transport layer and/or an electron injection layer may be appropriately disposed between the electrode 125 and the emitting layer 124.

The sealing resin layer 13 is formed of the above-described resin composite. In order to prevent entry of water, the sealing resin layer 13 may be made to contain a desiccant (such as calcium oxide or silica gel).

The sealing substrate 14 can be selected from substrates usable as substrates through which light is not extracted in known bottom emission type organic EL devices. The sealing substrate 14 may be selected from substrates that tend not to allow water to pass therethrough, such as glass substrates, metal plates, and inorganic-film-coated resin substrates.

The organic EL device 1 can be produced by, for example, the following method. On the transparent substrate 11, the transparent electrode 121, the hole injection layer 122, the hole transport layer 123, the emitting layer 124, and the electrode 125 are formed in this order. Thus, the organic EL element 12 is formed. On the other hand, on a single surface of the sealing substrate 14, the material of the sealing resin layer 13, that is, the above-described resin composite is placed and heated. The transparent substrate 11 on which the organic EL element 12 is disposed and the sealing substrate 14 on which the resin composite has been placed and softened by heating are bonded together via the resin composite such that the organic EL element 12 faces the resin composite. As a result, the transparent substrate 11, the organic EL element 12, the sealing resin layer 13, and the sealing substrate 14 are integrated. If necessary, the periphery of the obtained multi-layer film may be sealed with resin. The layers constituting the organic EL element 12 can be formed by known methods used for producing typical organic EL elements.

In the organic EL device 1, the matrix resin component tends not to permeate the organic EL element 12 and a large amount of the low molecular weight organic component does not permeate the organic EL element 12. Thus, destruction of the element structure due to entry of the resin composite into the element tends not to occur. In addition, inhibition of movements of electrons and holes tends not to occur. As a result, the organic EL device 1 has a long luminance life and high reliability.

In the organic EL device 1, the content of an organic component having a molecular weight of less than 500 may be less than 5.1 ppm. In this case, the effects exerted by the low molecular weight organic component on the organic EL element 12 can be further reduced. Thus, a decrease in the luminance life of the organic EL device 1 can be suppressed with more certainty and the reliability of the organic EL device 1 can be further enhanced.

The organic EL device 1 may contain, as the matrix resin component, a resin obtained by polymerizing at least one selected from methacrylic monomers and acrylic monomers. In this case, an organic EL device having a long luminance life can be provided.

The organic EL device 1 may contain, as the matrix resin component, a polyester resin, a polyurethane resin, or a polystyrene resin. In this case, a resin composite can be easily provided in which the matrix resin component is constituted by at least one resin having a molecular weight of 5000 or more and the content of an organic component having a molecular weight of less than 500 is less than 6 ppm.

Second Embodiment

Figure 2:
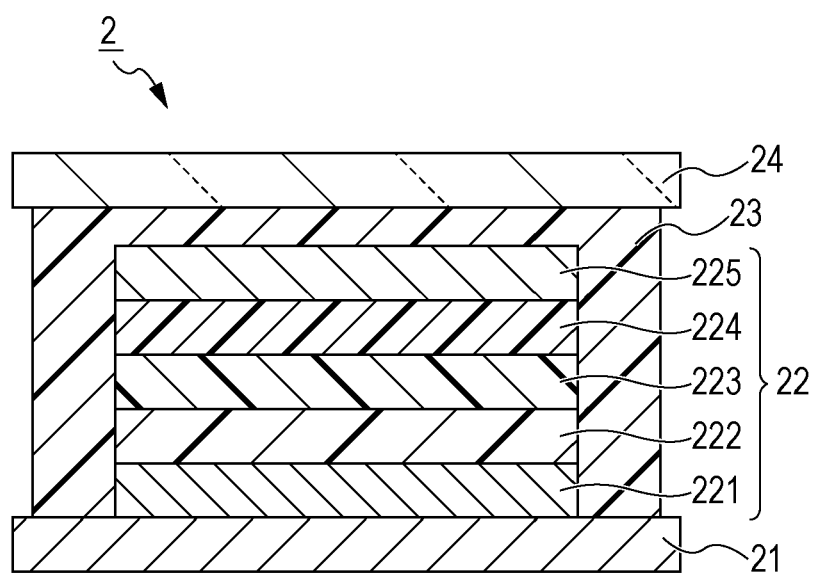
FIG. 2 is a cross sectional view of a top emission type organic EL device according to a second embodiment of the present disclosure.

In this embodiment, another example of organic EL devices, that is, a top emission type organic EL device will be described. An organic EL device 2 in FIG. 2 is an example of top emission type organic EL devices. The organic EL device 2 includes a substrate 21; an organic EL element 22 disposed on the substrate 21; a sealing resin layer 23 disposed on the surfaces of the substrate 21 and the organic EL element 22 so as to cover the surface of the organic EL element 22; and a sealing substrate 24 bonded to the substrate 21 via the sealing resin layer 23. The sealing resin layer 23 may be at least partially in contact with the organic EL element 22.

Light emitted from the organic EL element 22 is extracted through the sealing resin layer 23 and the sealing substrate 24. Accordingly, the sealing substrate 24 is formed of a transparent material and may be selected from transparent substrates (such as glass substrates) used for known organic EL devices.

Since the sealing resin layer 23 is also disposed on the light extraction side of the organic EL element 22, the sealing resin layer 23 needs to be transparent. Accordingly, the sealing resin layer 23 is formed of a material that is the resin composite in the first embodiment and that is transparent. The sealing resin layer 23 may have a high refractive index from the standpoint of light extracting efficiency.

The substrate 21 may be transparent or opaque. The substrate 21 can be selected from substrates usable as substrates through which light is not extracted in known top emission type organic EL devices. The substrate 21 is not particularly limited in terms of shape, structure, size, or the like and can be appropriately selected in accordance with the desired organic EL device.

The organic EL element 22 includes a multi-layer film including an electrode (cathode) 221 disposed on the substrate 21, an emitting layer 222 disposed on the electrode 221, a hole transport layer 223 disposed on the emitting layer 222, a hole injection layer 224 disposed on the hole transport layer 223, and a transparent electrode (anode) 225 disposed on the hole injection layer 224. In this example, the emitting layer 222, the hole transport layer 223, and the hole injection layer 224 correspond to the organic layer including an emitting layer. The configuration of the multi-layer film constituting the organic EL element 22 is not limited to this example because the organic EL element 22 can be selected from organic EL elements used for known top emission type organic EL devices. For example, if necessary, an electron transport layer and/or an electron injection layer may be appropriately disposed between the electrode 221 and the emitting layer 222.

The organic EL device 2 can be produced by, for example, the following method. On the substrate 21, the electrode 221, the emitting layer 222, the hole transport layer 223, the hole injection layer 224, and the transparent electrode 225 are formed in this order. Thus, the organic EL element 22 is formed. On the other hand, on a single surface of the sealing substrate 24, the material of the sealing resin layer 23, that is, the resin composite in the first embodiment is placed and heated. The substrate 21 on which the organic EL element 22 is disposed and the sealing substrate 24 on which the resin composite has been placed and softened by heating are bonded together via the resin composite such that the organic EL element 22 faces the resin composite. As a result, the substrate 21, the organic EL element 22, the sealing resin layer 23, and the sealing substrate 24 are integrated. If necessary, the periphery of the obtained multi-layer film may be sealed with resin. The layers constituting the organic EL element 22 can be formed by known methods used for producing typical organic EL elements.

The organic EL device 2 provides advantages of the first embodiment and also allows a high light extracting efficiency since the space between the organic EL element 22 and the sealing substrate 24 disposed on the light extraction side of the organic EL device 2 is filled with the resin composite.

Third Embodiment

Figure 3:
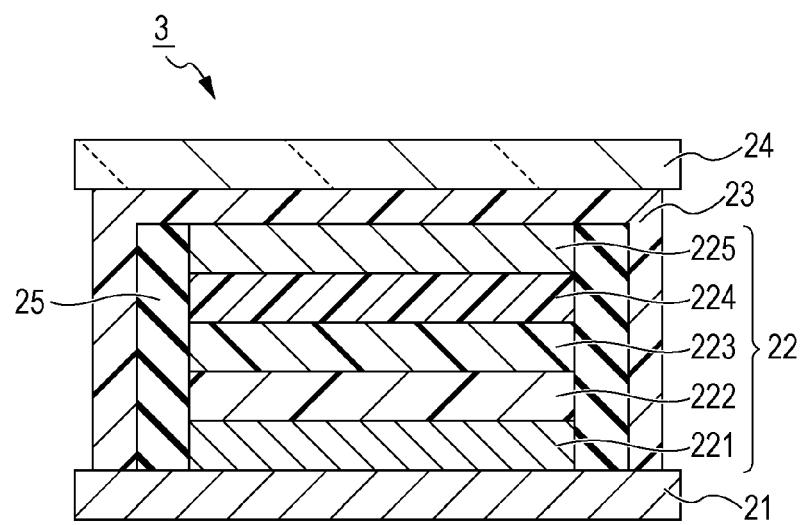
FIG. 3 is a cross sectional view of a top emission type organic EL device according to a third embodiment of the present disclosure.
Figure 4:
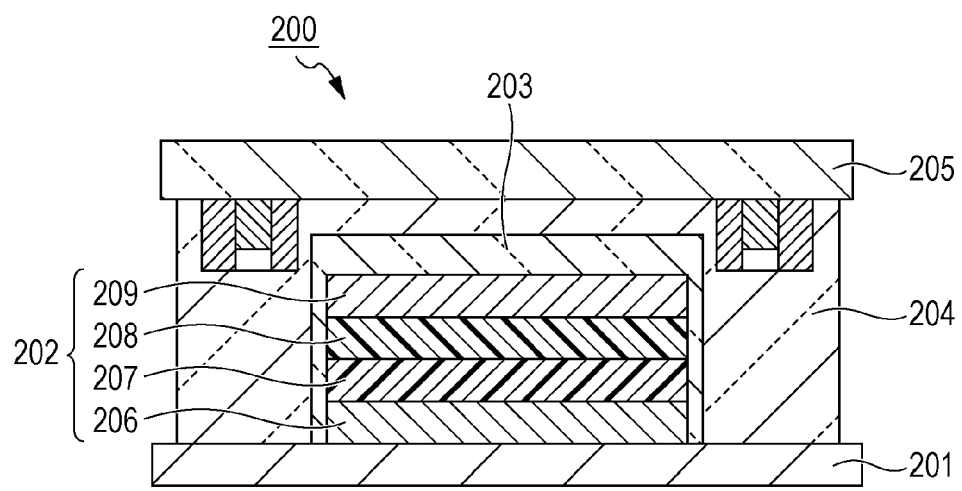
FIG. 4 is a schematic cross-sectional view of a typical top emission type organic EL device.

In this embodiment, another example of organic EL devices, that is, a top emission type organic EL device will be described. An organic EL device 3 in FIG. 3 is different from the organic EL device of the second embodiment in that an insulating layer 25 is disposed on the side of the organic EL device. The other configuration is the same as in the organic EL device 2 of the second embodiment. Accordingly, the insulating layer 25 will be described and descriptions of the other configuration are omitted.

The insulating layer 25 is disposed on the side of the organic EL element 22. The insulating layer 25 may be disposed in direct contact with the side surface of the organic EL element 22. The insulating layer 25 may be disposed so as to cover an entire portion of the side surface of the organic EL element 22 and so as to surround the organic EL element 22. Examples of the material of the insulating layer 25 include insulating organic materials such as acrylic and polyimide and insulating inorganic materials such as $SiO_x$ and $SiN_x$.

Although the organic EL device 3 can be produced by a method similar to that in the second embodiment, a step of forming the insulating layer 25 is additionally performed. In the case of using an organic material, the insulating layer 25 can be formed by a coating process such as print coating or an inkjet process. In the case of using an inorganic material, the insulating layer 25 can be formed by, for example, a sputtering process. Hereinafter, regarding the case of using an organic material, an example of steps of producing the organic EL device 3 will be described.

The method for producing the organic EL device 3 of this embodiment is the same as in the second embodiment up to and including the formation of the hole injection layer 224. After the formation of the hole injection layer 224, the material of the insulating layer 25 is applied by print coating so as to surround the side surface of the organic EL element 22. The applied material is dried, so that the insulating layer 25 is formed. After the formation of the insulating layer 25, the transparent electrode 225 is formed within the region surrounded by the insulating layer 25. When the transparent electrode 225 is formed of a conductive polymer, the transparent electrode 225 may be formed by a coating process within the region surrounded by the insulating layer 25. Thus, the organic EL element 22 and the insulating layer 25 are formed. The subsequent steps are the same as in the second embodiment.

The organic EL device 3 provides advantages of the first and second embodiments and also allows suppression of leakage between the electrode 221 and the transparent electrode 225 because the side surface of the organic EL element 22 is covered with the insulating layer 25. In this case, the insulating layer 25 may cover an entire portion of the side surface of the organic EL element 22. And the insulating layer 25 may be in contact with an entire portion of the side surface of the organic EL element 22. As a result, leakage between the electrodes can be suppressed with more certainty.

The organic EL device 3 also allows a high light extracting efficiency since the space between the organic EL element 22 and the sealing substrate 24 disposed on the light extraction side of the organic EL device 3 is filled with the resin composite. In the present embodiment, the insulating layer 25 is not formed over the transparent electrode 225 disposed on the light extraction side of the organic EL device 3. Accordingly, reflection and interference at an interface due to the presence of the insulating layer can be reduced. As a result, in the organic EL device 3, a high light extracting efficiency and high reliability can be achieved.

EXAMPLES

Hereinafter, the present disclosure will be described further in detail with reference to Examples. However, the present disclosure is not limited to these Examples.

Synthesis examples 1 to 4 of thermoplastic resins used as matrix resin components in resin composites in Examples and Comparative examples will be described.

Synthesis Example 1

Synthesis of Methyl Methacrylate-Butyl Acrylate Copolymer

Into a 500 mL separable flask having been dried, 361 g of methyl methacrylate, 16.4 g of butyl acrylate, 361 g of benzene, and 0.722 g of azobisisobutyronitrile were placed. The resultant solution was heated at 60° C. for 6.5 hours while being shaken discontinuously. Thus, a polymerization reaction between methyl methacrylate and butyl acrylate was caused. The reaction product was dissolved in 3 L of methyl ethyl ketone and, from the resultant solution, a polymer was precipitated in an amount of hexane seven times the amount of the solution.

Synthesis Example 2

Synthesis of Polyester Resin

Into a 2000 mL flask equipped with a reflux apparatus for dehydration, 616 g of a dicarboxylic acid component constituted by 350 g of adipic acid and 266 g of terephthalic acid, and 488 g of 1,6-hexanediol (number of methylene groups: 6) serving as a diol component were placed. To this solution, 0.05 g of tetraisopropyl titanate serving as a reaction catalyst was added. Subsequently, a polycondensation reaction was caused at 220° C. to provide a polymer.

Synthesis Example 3

Synthesis of Polyurethane Resin

Into a 500 mL separable flask, 48.1 g of dimethyl terephthalate (manufactured by Wako Pure Chemical Industries, Ltd.) and 112 g of 3-amino-1-propanol (manufactured by Wako Pure Chemical Industries, Ltd.) were placed and subjected to heat drying at 135° C. for 6.5 hours under nitrogen gas stream. To the reaction mixture, isopropyl alcohol was slowly added to thereby provide 59.8 g of N,N-bis(3-hydroxypropyl)terephthalic acid amide, which is an amide group-containing diol. Under a nitrogen gas atmosphere, into a reactor equipped with a mixer, 8.72 g of N,N-bis(3-hydroxypropyl)terephthalic acid amide, 29.8 g of polyethylene glycol (trade name: PEG2000U, manufactured by NOF CORPORATION), and 50 g of dehydrated dimethylacetamide (organic solvent, manufactured by Wako Pure Chemical Industries, Ltd.) were placed and heated at 100° C. under stirring to thereby provide a uniform solution. To this solution, a solution prepared by dissolving 11.5 g of 4,4-diphenylmethane diisocyanate (manufactured by Wako Pure Chemical Industries, Ltd.) in 10 g of dehydrated dimethylacetamide was gradually dropped. After the dropping was completed, the solution was heated for an hour under stirring. The reaction solution was cooled to 80° C. and subsequently reprecipitation was caused with 620 g of acetonitrile. The solid precipitate was isolated by filtration and then washed twice with 160 g of acetonitrile. Thus, a polymer was obtained.

Synthesis Example 4

Synthesis of Polystyrene Resin

To each of two 25 mL sealable glass ampoules, a solution prepared by dissolving 59 mg of azobisisobutyronitrile and 44.5 mg of benzoyl peroxide in 10 mL of styrene was added. The ampoule was connected to a vacuum line, cooled with a dry ice-methanol bath, sufficiently purged with nitrogen gas, and then heat-sealed in a vacuum. The sealed tube was placed in a shaking type thermostatic chamber kept at 60° C. and a polymerization reaction was caused for 7.5 hours under shaking. The sealed tube was taken out and cooled with a dry ice-methanol bath to terminate polymerization. The sealed tube was opened and the content of the tube was poured into 200 mL of methanol being stirred. Thus, polymer precipitate was obtained.

Example 1

The polymer obtained in Synthesis example 1 was dried at 200° C. for 3 hours within a glove box purged with nitrogen gas and having a dew point of −90° C. Thus, the content of an organic component having a molecular weight of less than 500 in the polymer was reduced and a resin composite of Example 1 was obtained. Although the content of the organic component having a molecular weight of less than 500 was measured by a method described below, the organic component having a molecular weight of less than 500 was not detected. In other words, the content of the organic component having a molecular weight of less than 500 in the resin composite of Example 1 was found to be less than the detection limit, that is, less than 0.1 ppm. The molecular weight of the matrix resin component was measured by a method described below and the molecular weight distribution was in the range of 5000 to 100000.

Example 2

A resin composite of Example 2 was obtained as in Example 1 except that the drying conditions were changed such that the polymer was dried at 160° C. for 3 hours. The content of an organic component having a molecular weight of less than 500 was measured by a method described below. As a result, the content of the organic component having a molecular weight of less than 500 in the resin composite of Example 2 was 5 ppm.

Example 3

A resin composite of Example 3 was obtained by adding hydroquinone (molecular weight: 110) to the resin composite of Example 1 such that the content of hydroquinone became 5 ppm. The content of the organic component having a molecular weight of less than 500 in the resin composite of Example 1 was less than 0.1 ppm. Accordingly, the content of the organic component having a molecular weight of less than 500 in the resin composite of Example 3 was estimated to be less than 5.1 ppm.

Example 4

A resin composite of Example 4 was obtained by adding dibutylhydroxytoluene (molecular weight: 220) to the resin composite of Example 1 such that the content of dibutylhydroxytoluene became 5 ppm. The content of the organic component having a molecular weight of less than 500 in the resin composite of Example 1 was less than 0.1 ppm. Accordingly, the content of the organic component having a molecular weight of less than 500 in the resin composite of Example 4 was estimated to be less than 5.1 ppm.

Example 5

A resin composite of Example 5 was obtained by adding bisphenol A epoxy acrylate (molecular weight: 510) to the resin composite of Example 1 such that the content of bisphenol A epoxy acrylate became 6 ppm. The content of the organic component having a molecular weight of less than 500 in the resin composite of Example 1 was less than 0.1 ppm. Accordingly, the content of the organic component having a molecular weight of less than 500 in the resin composite of Example 5 was also estimated to be less than 0.1 ppm.

Example 6

A resin composite of Example 6 was obtained by adding bisphenol A epoxy acrylate (molecular weight: 510) to the resin composite of Example 1 such that the content of bisphenol A epoxy acrylate became 20 ppm. The content of the organic component having a molecular weight of less than 500 in the resin composite of Example 1 was less than 0.1 ppm. Accordingly, the content of the organic component having a molecular weight of less than 500 in the resin composite of Example 6 was also estimated to be less than 0.1 ppm.

Example 7

The polymer obtained in Synthesis example 2 was dried in the same manner as in Example 1. Thus, the content of an organic component having a molecular weight of less than 500 in the polymer was reduced and a target resin composite was obtained. Although the content of the organic component having a molecular weight of less than 500 was measured by a method described below, the organic component having a molecular weight of less than 500 was not detected. In other words, the content of the organic component having a molecular weight of less than 500 in the resin composite of Example 7 was found to be less than the detection limit, that is, less than 0.1 ppm. The molecular weight of the matrix resin component was measured by a method described below and the molecular weight distribution was in the range of 5000 to 15000.

Example 8

The polymer obtained in Synthesis example 3 was dried in the same manner as in Example 1. Thus, the content of an organic component having a molecular weight of less than 500 in the polymer was reduced and a target resin composite was obtained. Although the content of the organic component having a molecular weight of less than 500 was measured by a method described below, the organic component having a molecular weight of less than 500 was not detected. In other words, the content of the organic component having a molecular weight of less than 500 in the resin composite of Example 8 was found to be less than the detection limit, that is, less than 0.1 ppm. The molecular weight of the matrix resin component was measured by a method described below and the molecular weight distribution was in the range of 5000 to 20000.

Example 9

The polymer obtained in Synthesis example 4 was dried in the same manner as in Example 1. Thus, the content of an organic component having a molecular weight of less than 500 in the polymer was reduced and a target resin composite was obtained. Although the content of the organic component having a molecular weight of less than 500 was measured by a method described below, the organic component having a molecular weight of less than 500 was not detected. In other words, the content of the organic component having a molecular weight of less than 500 in the resin composite of Example 9 was found to be less than the detection limit, that is, less than 0.1 ppm. The molecular weight of the matrix resin component was measured by a method described below and the molecular weight distribution was in the range of 5000 to 100000.

Comparative Example 1

A resin composite of Comparative example 1 was obtained in the same manner as in Example 1 except that the amount of azobisisobutyronitrile was changed to 0.1 g. The molecular weight of the matrix resin component was measured by a method described below and the molecular weight distribution was in the range of 2000 to 4000.

Comparative Example 2

A resin composite of Comparative example 2 was obtained in the same manner as in Example 1 except that the drying conditions were changed such that the polymer was dried at 150° C. for 3 hours. The content of an organic component having a molecular weight of less than 500 was measured by a method described below. As a result, the content of the organic component having a molecular weight of less than 500 in the resin composite of Comparative example 2 was 6 ppm.

Comparative Example 3

A resin composite of Comparative example 3 was obtained in the same manner as in Example 1 except that the drying conditions were changed such that the polymer was dried at 130° C. for 3 hours. The content of an organic component having a molecular weight of less than 500 was measured by a method described below. As a result, the content of the organic component having a molecular weight of less than 500 in the resin composite of Comparative example 3 was 20 ppm.

Measurement Method of Molecular Weight Distribution of Matrix Resin Component

The molecular weight distribution of the matrix resin component of each resin composite was measured by gel-permeation chromatography (GPC). This measurement was performed with a GPC instrument (model: HLC-8220GPC, manufactured by Tosoh Corporation), with columns (TSKgel Guardcolumn SuperHZ-L, TSKgel SuperHZ3000, TSKgel SuperHZ2000, and TSKgel SuperHZ1000, manufactured by Tosoh Corporation), and with a pretreatment filter (Chromato Disc 13N 0.45, manufactured by KURABO INDUSTRIES LTD.). The measurement was performed at a column temperature of 45° C., at a flow rate of 0.6 mL/min, and with a differential refractometer (RI detector). Molecular weight at each peak was calculated from the GPC charts of the samples on the basis of an analytical curve formed from a GPC chart of standard polystyrene.

Measurement Method of Content of Organic Component Having Molecular Weight of Less than 500

The content of the low molecular weight organic component in each resin composite was measured with a gas chromatography-mass spectrometer (GC-MS). The resin composite having been subjected to a decompressing step was heated under a helium atmosphere. Organic components released from the overheated resin composite were collected with liquid nitrogen and analyzed with the GC-MS. The GC-MS analysis was performed with 6890GC (manufactured by Agilent Technologies). Ionization was performed by EI method (electron ionization method). Columns used in the analysis were DM5 ms (manufactured by Agilent Technologies). The resin composite was heated from 40° C. to 250° C.

Subsequently, the resin composites of Examples 1 to 9 and Comparative examples 1 to 3 were used to produce organic EL devices. For each of Examples and Comparative examples, two organic EL devices that were a bottom emission type organic EL device and a top emission type organic EL device were produced. The methods of producing the organic EL devices were as follows.

Methods of Producing Organic EL Devices

Method of Producing Bottom Emission Type Organic EL Device

An organic EL device having the same configuration as the organic EL device 1 in FIG. 1 was produced. The transparent substrate 11 was an alkali free glass substrate having a thickness of 0.7 mm (No. 1737, manufactured by Corning Incorporated). On this substrate 11, an ITO layer having a thickness of 150 nm was formed by sputtering with an ITO target (manufactured by Tosoh Corporation). This substrate 11 having the ITO layer thereon was subjected to an annealing treatment under an Ar atmosphere at 200° C. for about an hour, so that the transparent electrode (anode) 121 was formed.

Subsequently, on the anode 121, a solution of poly(ethylenedioxythiophene)-poly(styrenesulfonate) (PEDOT-PSS, "CLEVIOS P VP AI4083 (a descriptive name) sold under the trademark CLEVIOS" manufactured by Heraeus, PEDOT:PSS=1:6) and isopropyl alcohol mixed in a ratio of 1:1 was applied with a spin coater so as to form a PEDOT-PSS layer having a thickness of 30 nm. The layer was baked at 150° C. for 10 minutes to provide the hole injection layer 122.

After the formation of the hole injection layer 122, a solution in which, in tetrahydrofuran (THF) solvent, TFB (Poly [(9,9-dioctylfluorenyl-2,7-diyl)-co-(4,4'-(N-(4-sec-butylphenyl))diphenyl amine)], "Hole Transport Polymer ADS259BE" manufactured by American Dye Source, Inc.) was dissolved at 1 wt % was applied to the hole injection layer 122 with a spin coater so as to form a TFB layer having a thickness of about 12 nm. This layer was baked at 200° C. for 10 minutes to provide the hole transport layer 123.

Subsequently, a solution in which, in tetrahydrofuran (THF) solvent, a red light emitting polymer ("Light Emitting polymer ADS111RE" manufactured by American Dye Source, Inc.) was dissolved at 1 wt % was applied to the hole transport layer 123 with a spin coater so as to form a layer having a thickness of about 80 nm. This layer was baked at 100° C. for 10 minutes to provide the emitting layer 124.

Subsequently, an aluminum layer having a thickness of 80 nm was formed on the emitting layer 124 by vacuum vapor deposition to thereby provide the electrode (cathode) 125. Thus, the organic EL element 12 was produced.

Subsequently, the organic EL element 12 was sealed. Specifically, within a glove box purged with nitrogen gas and having a dew point of −90° C., a glass substrate for sealing (sealing substrate 14) to which a resin composite was applied was placed on a hot plate having been heated at 150° C. The resin composite applied to the glass substrate is a resin composite according to an embodiment of the present disclosure used for forming the sealing resin layer 13 of the organic EL device 1. The substrate 11 on which the organic EL element 12 was disposed was bonded with the sealing substrate 14 on which the resin composite was placed such that the organic EL element 12 faced the resin composite. The periphery of the obtained multi-layer film was sealed with an epoxy resin (product name: XNR5570-B1, manufactured by Nagase ChemteX Corporation). After that, the resultant member was taken out of the glove box and the epoxy resin was cured with an UV curing apparatus (100 mW/cm², 60 seconds).

By the above-described method, the organic EL device 1 was produced.

Method of Producing Top Emission Type Organic EL Device 5

An organic EL device having the same configuration as the organic EL device 2 in FIG. 2 was produced. The substrate 21 was an alkali free glass substrate having a thickness of 0.7 mm (No. 1737, manufactured by Corning Incorporated). On this substrate 21, an aluminum layer having a thickness of 80 nm was formed by vacuum vapor deposition to thereby provide the electrode (cathode) 221.

Subsequently, a solution in which, in tetrahydrofuran (THF) solvent, a red light emitting polymer ("Light Emitting polymer ADS111RE" manufactured by American Dye Source, Inc.) was dissolved at 1 wt % was applied to the cathode 221 with a spin coater so as to form a layer having a thickness of about 80 nm. The layer was baked at 100° C. for 10 minutes to provide the emitting layer 222.

Subsequently, a solution in which, in THF solvent, TFB (Poly[(9,9-dioctylfluorenyl-2,7-diyl)-co-(4,4'-(N-(4-sec-butylphenyl))diphenyl amine)], "Hole Transport Polymer ADS259BE" manufactured by American Dye Source, Inc.) was dissolved at 1 wt % was applied to the emitting layer 222 with a spin coater so as to form a TFB layer having a thickness of about 12 nm. The TFB layer was baked at 200° C. for 10 minutes to provide the hole transport layer 223.

On the hole transport layer 223, a solution of poly(ethylenedioxythiophene)-poly(styrenesulfonate) (PEDOT-PSS, "CLEVIOS P VP AI4083 (a descriptive name) sold under the trademark CLEVIOS" manufactured by Heraeus, PEDOT: PSS=1:6) and isopropyl alcohol mixed in a ratio of 1:1 was applied with a spin coater so as to form a PEDOT-PSS layer having a thickness of 30 nm. The layer was baked at 150° C. for 10 minutes to provide the hole injection layer 224.

A solution was prepared by mixing ITO nano particles dispersion liquid (particle size: about 40 nm, ITCW15 wt %-G30, manufactured by C. I. Kasei Company, Limited) with methylcellulose (60SH manufactured by Shin-Etsu Chemical Co., Ltd.) such that the content of methylcellulose became 5 wt %. On the hole injection layer 224, this solution was applied in a pattern with a screen printing apparatus so as to form a layer having a thickness of about 150 nm. The patterned layer was dried at 120° C. for 15 minutes to thereby provide the transparent electrode (anode) 225. Thus, the organic EL element 22 was produced.

Subsequently, the organic EL element 22 was sealed. Specifically, within a glove box having been purged with nitrogen gas and having a dew point of −90° C., a glass substrate for sealing (sealing substrate 24) to which a resin composite was applied) was placed on a hot plate having been heated at 150° C. The resin composite applied to the glass substrate is a resin composite according to an embodiment of the present disclosure used for forming the sealing resin layer 23 of the organic EL device 2. The substrate 21 on which the organic EL element 22 was disposed was bonded with the sealing substrate 24 on which the resin composite was placed such that the organic EL element 22 faced the resin composite. The periphery of the obtained multi-layer film was sealed with an epoxy resin (product name: XNR5570-B1, manufactured by Nagase ChemteX Corporation). After that, the resultant member was taken out of the glove box and the epoxy resin was cured with an UV curing apparatus (100 mW/cm², 60 seconds).

By the above-described method, the organic EL device 2 was produced.

The organic EL devices produced with the resin composites of Example 1 to 9 and Comparative examples 1 to 3 were measured in terms of luminance life by the following method.

Method of Measuring Luminance Life of Organic EL Devices

A DC power source (manufactured by Keithley Instruments, Inc.) was used and a current flowing through each organic EL device was kept at 10 mA/cm². After the lapse of 100 hours from the start of flow of the current, the luminance of the organic EL device was measured with a luminance meter (manufactured by TOPCON CORPORATION). The front luminance of an organic EL device in which a sealing resin layer 23 is not disposed on the surfaces of the organic EL element (unsealed organic EL device) was used as a reference (100%). Organic EL devices that had a luminance maintenance ratio of 95% or more were evaluated as non-defective products.

Table 1 describes the resin composites of Examples 1 to 9 and the luminance life of organic EL devices produced with these resin composites (luminance maintenance ratio after the lapse of 100 hours from the start of flow of the current). Table 2 describes the resin composites of Comparative examples 1 to 3 and the luminance life of organic EL devices produced with these resin composites (luminance maintenance ratio after the lapse of 100 hours from the start of flow of the current).

TABLE 1

| | | Unit | Example 1 | Example 2 | Example 3 | Example 4 | Example 5 | Example 6 | Example 7 | Example 8 | Example 9 |
|---|---|---|---|---|---|---|---|---|---|---|---|
| Resin composite | Resin system | | Methyl methacrylate-butyl acrylate copolymer resin | | | | | | Polyester resin | Polyurethane resin | Polystyrene resin |
| | Molecular weight distribution of matrix resin component | | 5,000 to 100,000 | | | | | | 5,000 to 15,000 | 5,000 to 20,000 | 5,000 to 100,000 |
| | Low molecular weight organic component (molecular weight: less than 500) | Polymerization termination component of raw material of matrix resin component | ppm | <0.1 | 5 | <0.1 | <0.1 | <0.1 | <0.1 | <0.1 | <0.1 | <0.1 |
| | | Hydroquinone (molecular weight: 110) | | | | | 5 | | | | | |
| | | Dibutylhydroxy-toluene (molecular weight: 220) | | | | | | 5 | | | | |
| | Bisphenol A epoxy acrylate (molecular weight: 510) | | | | | | | | 6 | 20 | | |

TABLE 1-continued

|  |  | Unit | Example 1 | Example 2 | Example 3 | Example 4 | Example 5 | Example 6 | Example 7 | Example 8 | Example 9 |
|---|---|---|---|---|---|---|---|---|---|---|---|
| Top emission type organic EL device | Luminance maintenance ratio after lapse of 100 hours from start of flow of current* | % | 98 | 95 | 95 | 95 | 96 | 95 | 95 | 96 | 97 |
| Bottom emission type organic EL device | Luminance maintenance ratio after lapse of 100 hours from start of flow of current* | % | 96 | 95 | 95 | 96 | 95 | 95 | 96 | 96 | 98 |

*The ratio of luminance relative to the luminance (100%) of unsealed organic EL device

TABLE 2

|  |  | Unit | Comparative example 1 | Comparative example 2 | Comparative example 3 |
|---|---|---|---|---|---|
| Resin composite | Resin system |  | Methyl methacrylate-butyl acrylate copolymer resin | | |
|  | Molecular weight distribution of matrix resin component |  | 2,000 to 4,000 | 5,000 to 100,000 | |
|  | Low molecular weight organic component (molecular weight: less than 500) | Polymerization termination component of raw material of matrix resin component (molecular weight: less than 500) | ppm | <0.1 | 6 | 20 |
| Top emission type organic EL device | Luminance maintenance ratio after lapse of 100 hours from start of flow of current* | % | 70 | 93 | 50 |
| Bottom emission type organic EL device | Luminance maintenance ratio after lapse of 100 hours from start of flow of current* | % | 71 | 94 | 52 |

*The ratio of luminance relative to the luminance (100%) of unsealed organic EL device In Table 1, regarding the organic EL devices of Examples 1 to 9 in which the sealing resin layers were formed of resin composites according to embodiments of the present disclosure, the bottom emission type devices and the top emission type devices each had a luminance maintenance ratio of 95% or more. In contrast, the luminance maintenance ratio was less than 95% in the organic EL devices of Comparative example 1 in which the molecular weight of the resin constituting the matrix resin component was less than 5000 and in the organic EL devices of Comparative examples 2 and 3 in which the content of the low molecular weight organic component was 6 ppm or more.

Organic electroluminescence devices according to the present disclosure can be used in, for example, lighting applications.

What is claimed is:

1. An organic electroluminescence device comprising:
   an organic electroluminescence element including a pair of electrodes and an organic layer disposed between the pair of electrodes, the organic layer including an emitting layer; and
   a sealing resin layer covering a surface of the organic electroluminescence element, the sealing resin layer including a thermoplastic resin composite, wherein
   the thermoplastic resin composite contains a matrix resin component constituted by at least one resin having a molecular weight of 5000 or more, and
   a content of an organic component having a molecular weight of less than 500 in the thermoplastic resin composite is less than 6 ppm.

2. The organic electroluminescence device according to claim 1, wherein the content of the organic component having a molecular weight of less than 500 in the thermoplastic resin composite is less than 5.1 ppm.

3. The organic electroluminescence device according to claim 1, wherein the matrix resin component includes a resin obtained by polymerizing at least one selected from methacrylic monomers and acrylic monomers.

4. The organic electroluminescence device according to claim 1, wherein the matrix resin component includes a polyester resin.

5. The organic electroluminescence device according to claim 1, wherein the matrix resin component includes a polyurethane resin.

6. The organic electroluminescence device according to claim 1, wherein the matrix resin component includes a polystyrene resin.

7. The organic electroluminescence device according to claim 1, wherein the sealing resin layer is at least partially in contact with the organic electroluminescence element.

8. The organic electroluminescence device according to claim 1, further comprising:
   an insulating layer disposed in contact with a side surface of the organic electroluminescence element, wherein the sealing resin layer covers the side surface of the organic electroluminescence element with the insulating layer disposed between the sealing resin layer and the organic electroluminescence element.

9. The organic electroluminescence device according to claim 8, wherein the insulating layer is disposed in contact with an entire portion of the side surface of the organic layer.

\* \* \* \* \*